(12) United States Patent
Zhang

(10) Patent No.: US 6,784,731 B2
(45) Date of Patent: Aug. 31, 2004

(54) SYSTEM AND METHOD FOR REDUCING AMPLIFIER DISTORTION USING DISTORTION FEEDBACK

(75) Inventor: Zexiang Zhang, Parsippany, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 73 days.

(21) Appl. No.: 10/141,207

(22) Filed: May 8, 2002

(65) Prior Publication Data

US 2003/0210093 A1 Nov. 13, 2003

(51) Int. Cl.[7] .................................................. H03F 1/26
(52) U.S. Cl. ........................................ 330/149; 330/107
(58) Field of Search ................................ 330/107, 136, 330/149

(56) References Cited

U.S. PATENT DOCUMENTS 6,259,320 B1 * 7/2001 Valk et al. .................. 330/149
6,316,994 B1 * 11/2001 Frecassetti et al. ......... 330/149

* cited by examiner

*Primary Examiner*—Khanh Van Nguyen
(74) *Attorney, Agent, or Firm*—Julio A. Garceran

(57) ABSTRACT

An amplifier distortion reduction system obtains a distortion signal from the amplifier output and feeds the distortion signal back to the input side of the amplifier to cancel with the distortion produced at the amplifier output. For example, a signal to be amplified by an amplifier is received on a main signal path. The amplifier produces an amplified output with a non-distortion spectrum and a distortion spectrum. A sample of the amplified output is produced from the main signal path and placed on a feedback path. On the feedback path, the distortion spectrum is obtained from the sample amplified output. The distortion spectrum is phase and/or amplitude adjusted to produce the distortion signal. The distortion signal is placed onto the main signal path at the input side of the amplifier with the signal to be amplified to destructively combine with the distortion produced from the amplifier in amplifying the signal to be amplified.

17 Claims, 8 Drawing Sheets

190

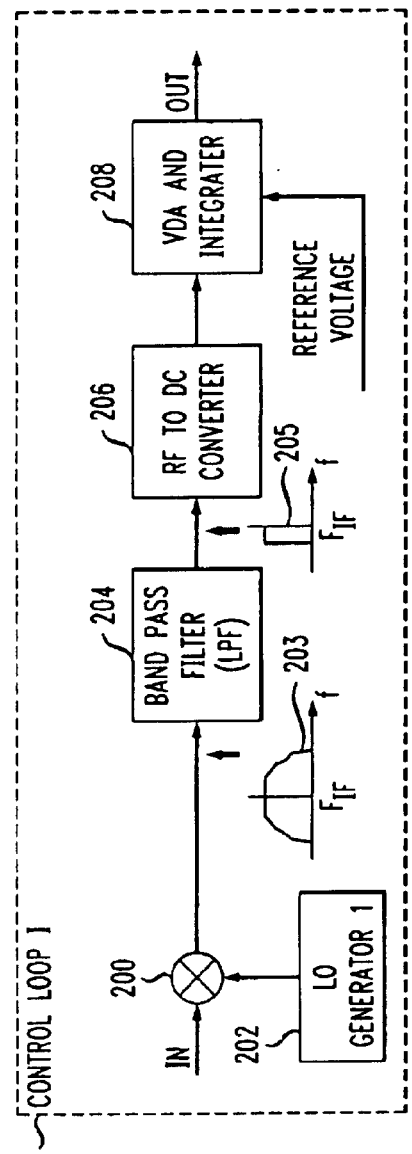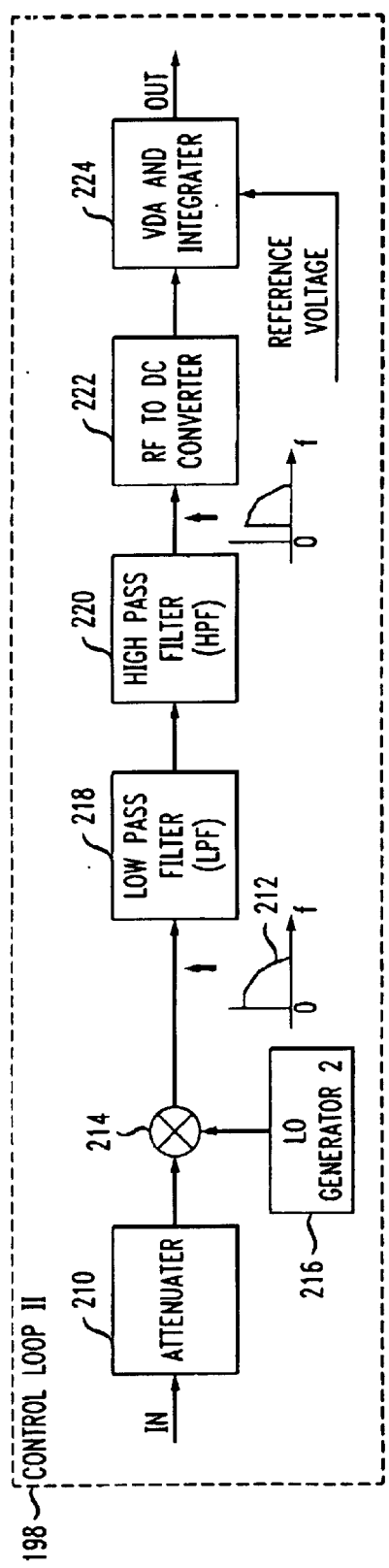
FIG. 6a
FIG. 6b

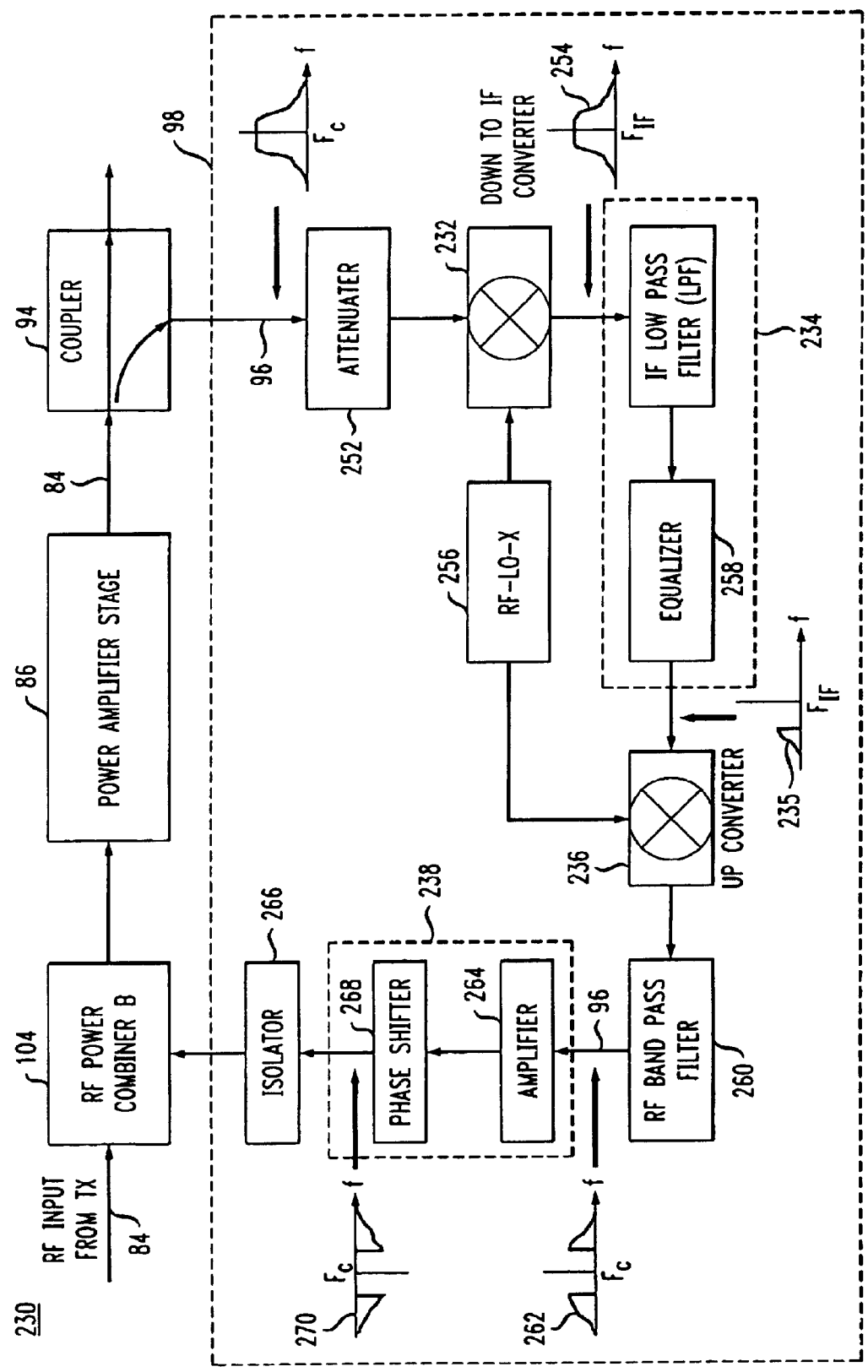

330

SYSTEM AND METHOD FOR REDUCING AMPLIFIER DISTORTION USING DISTORTION FEEDBACK

BACKGROUND OF THE INVENTION

1. Field of the Invention

This invention relates to a radio frequency (RF) signal amplification system producing an amplified signal with reduced distortion.

2. Description of Related Art

The relation between the output and the input of a RF power amplifier may be linear or non-linear depending on the amplitude of its input signal. "Linear" refers to the amplifier gain and phase shift being constant. "Non-linear" means both gain and phase shift are not constant. A distorted spectrum will be generated at the output of an amplifier if it operates in non-linear region. For example, if an input signal is a two single frequency carrier, an amplifier operating non-linearly produces multiple intermodulation (IMD) components at its output. If the input signal is a modulated channel with a definite bandwidth, the spectrum shape will be distorted (expanded, or what can be referred to as spectral regrowth) at the output.

Here, amplifier non-linearity is viewed from a spectral point of view. As such, no matter the type of input signal to be amplified, whether single frequency carriers or modulated channels, amplifier distortion will be described by spectral regrowth (including intermodulation components or distorted spectrum shape). The amplifier output waveform (spectrum) will be divided into "distortion spectrum" and "non-distortion" spectrum. The latter is the part with the same shape as the input signal and the former is the regrown spectrum.

Spectral regrowth directly raises the ACPR (adjacent channel power suppression ratio) and raises interference to adjacent channels. In most of wireless communication systems there are strong limitations to ACPR, and therefore, RF amplifiers have to be linearized (to reduce spectral regrowth) to meet communication requirements.

The simplest way to keep a radio frequency (RF) amplifier working linearly is to keep its output power much lower than its $P_{1dB}$ (1 dB output power suppression point) level. Unfortunately, in this case, the amplifier efficiency is very low. For example, a base station system requires ACPR of −56 dBc. If an RF power amplifier has $P_{1\ dB}$=40 dBm and $IP_3$ (third order intercept point) of −50 dBm, this amplifier can only operate to output 22 dBm to satisfy the ACPR requirement. This output level is 18 dB lower than its rating level. In this case, the amplifier efficiency will be very low (5% or less).

Various linearization methods are used to enable the use of more cost-effective and more power efficient amplifiers while maintaining an acceptable level of linearity. For example, predistortion techniques are commonly used to improve the performance of RF power amplifiers. Predistortion techniques distort the input signal prior to amplification by taking into account the transfer function characteristics for the amplifier. Digital predistortion techniques can linearize RF amplifiers effectively, but the circuit is complicated and costly. Furthermore, predistortion systems have to cover a wide bandwidth which is much wider than the bandwidth of the input signal, and therefore, there is difficulty in getting fast digital processing processors for real time linearization in case of wideband applications.

Feed-forward correction is another approach for linearization of RF power amplifiers. The basics of this technique is to cancel distortion on the output side of the amplifier. There are normally two additional loops in such kind of circuits. One loop is to obtain the amplifier distortion and the other loop is to amplify the distortion signal. The amplified distortion signal is fed forward to the output side of the amplifier and is used to cancel the distortion in the delayed main amplified signal. Because the cancellation is taken at the output side of the amplifier, and the fed forward distortion signal is coupled to the main signal path through a coupler, the power needed for the feed forward distortion signal is quite large. As such, an additional power amplifier for the distortion signal is needed. The need for the high power distortion amplifier (error amplifier) will considerably reduce the total efficiency of the amplifier module, and the error amplifier itself will introduce additional non-linearity problems.

Thus, other improved amplifier linearization techniques are desired, especially one which can reduce distortion over a wide frequency band of operation and maintain a reasonably high efficiency.

SUMMARY OF THE INVENTION

The present invention is an amplifier distortion reduction system which obtains a distortion signal from the amplifier output and feeds the distortion signal back to the input side of the amplifier to cancel with the distortion produced at the amplifier output. For example, a signal to be amplified by an amplifier is received on a main signal path. The amplifier produces an amplified output with a non-distortion spectrum and a distortion spectrum. A sample of the amplified output is produced from the main signal path and placed on a feedback path. On the feedback path, the distortion spectrum is obtained from the sample amplified output. The distortion spectrum is phase and/or amplitude adjusted to produce the distortion signal. The distortion signal is placed onto the main signal path at the input side of the amplifier with the signal to be amplified to destructively combine with the distortion produced from the amplifier in amplifying the signal to be amplified.

BRIEF DESCRIPTION OF THE DRAWINGS

Other aspects and advantages of the present invention may become apparent upon reading the following detailed description and upon reference to the drawings in which:

FIGS. 6a and 6b show embodiments of the control loops used in an embodiment of a multiple carrier amplifier distortion reduction system using distortion feedback according to principles of the present invention;

FIG. 7 shows another embodiment of the amplifier distortion reduction system using distortion feedback with conversion through an intermediate frequency (IF) band according to principles of the present invention;

DETAILED DESCRIPTION

Illustrative embodiments of an amplifier distortion reduction system and method using distortion feedback to reduce distortion according to the principles of the present invention are described below. The described feedback amplifier system uses RF distortion spectrum (or signal) cancellation to reduce distortion. A distortion spectrum is obtained from the sampled output signal of the main RF amplifier. In certain embodiments, the amplifier distortion reduction system using distortion feedback, which can be referred to as a feedback amplifier system, obtains on a feedback path the distortion spectrum from the output of the power amplifier by subtracting the non-distortion spectrum (which is a sample of the input signal to the power amplifier) from a sample of the output spectrum of the power amplifier. In other embodiments, the distortion spectrum is obtained on the feedback path by filtering out the non-distortion spectrum portion from a sample of the amplifier output.

The distortion spectrum is properly phase shifted and amplitude adjusted, then the resulting distortion signal is fed to the input side of the main RF amplifier, combined with the continuous input signal to be amplified. The amplified distortion signal will cancel with the distortion produced from amplifying the input signal. Because the distortion signal is typically much lower in power than the signal to be amplified, the nonlinearity of the amplifier to the distortion signal can be neglected. Moreover, since the distortion signal is of low power, the system can be implemented to avoid using extra power consuming devices on the feedback path, and the main amplifier can have higher power efficiency. This distortion reduction architecture can be of relatively simple construction. Since the amplifier distortion reduction system using distortion feedback does not depend on characteristics of the signal to be amplified, the system is flexible and can be applied to a variety of wireless communications. Accordingly, it can be applied to multi-channel wideband systems without the need for high speed digital processors although this system can be used along with other distortion reduction systems.

Figure 1:
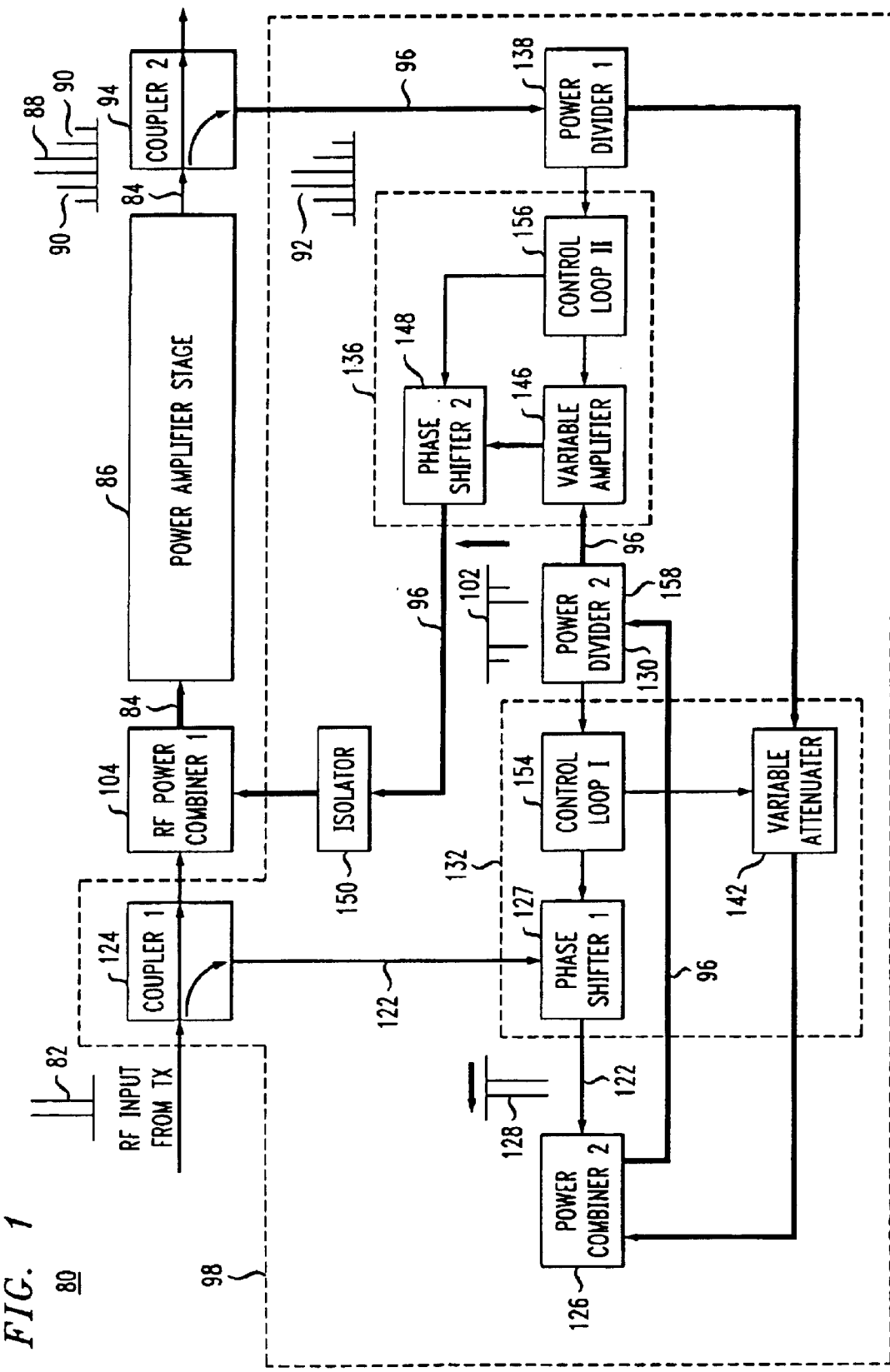
FIG. 1 shows an embodiment of the amplifier distortion reduction system using distortion feedback according to principles of the present invention.

FIG. 1 shows a general block diagram of a distortion reduction system 80 in which distortion feedback is injected back to the input of the amplifier to reduce distortion produced from the amplifier. In the amplifier architecture 80, an input signal 82 is received by the distortion reduction system 80 on a main signal path 84. The input signal 82 is to be amplified by an amplifier 86 on the main signal path 84. After amplifying the input signal 82, the amplifier 86 produces an amplified output signal 88 with distortion 90. A sample 92 of the amplifier output is obtained, for example by having a coupler 94 provide a sample 92 of the amplified output signal 88 onto a feedback path 96.

Distortion feedback circuitry 98 receives the sample amplifier output 92 on the feedback path 96 and produces a distortion signal using the sample amplifier output 92. The resulting distortion signal is placed on the main signal path 84, for example by a combiner 104, with the input signal to be amplified. After the amplifier 86 amplifies the input signal, the distortion generated by the amplifier 86 in amplifying the input signal is canceled by the amplified distortion signal, thereby reducing the distortion generated by the amplifier 86. The total distortion at the output of the amplifier 86 is reduced because the feedback distortion signal is produced with the proper phase and amplitude to destructively combine with the distortion generated by the amplifier 86 to the input signal. Ideally, the feedback distortion signal is produced such that the amplified feedback distortion signal will have the same amplitude but a 180 degree phase shift to the distortion signal generated by the amplifier 86 to the input signal 82.

Depending on the embodiment, the distortion feedback circuitry 98 can be implemented in different ways. In FIG. 1, a sample of the input signal is placed onto a carrier cancellation path 122, for example by coupler 124 on the main signal path 84. To produce the distortion signal, the distortion spectrum of the amplifier output is isolated on the feedback path 96. In this embodiment, a combiner 126 combines the sample amplifier output 92 (with non-distortion and distortion spectrums) on the feedback path 96 with an input signal sample 128 on the carrier cancellation path 122. The input signal sample 128 on the carrier cancellation path 122 is the inverse of the non-distortion spectrum of the amplifier output 92 on the feedback path. As such, the input signal sample 128 on the carrier cancellation path 122 combines with the non-distortion spectrum of the amplifier output 92 on the feedback path 96 to cancel the non-distortion spectrum on the feedback path 96, leaving the distortion spectrum on the feedback path 96.

In certain embodiments, a power divider 130 at the output of the combiner 126 on the feedback path 96 provides a signal representative of the signal remaining on the feedback path 96 after the combiner 126. A variable phase and/or amplitude adjuster 132 responsive to the signal representative of the remaining carrier signal on the feedback path 96 can adjust the relative phase and/or amplitude between the input signal sample 128 on the carrier cancellation path 122 and the sample amplified output signal to improve cancellation of the non-distortion spectrum on the feedback path 96. Depending on the embodiment, a phase and/or amplitude adjuster can be located on different paths to provide a desired amplitude and/or phase relationship between combining signals on the different paths to get the desired cancellation.

A distortion signal 102 is produced from the distortion spectrum left on the feedback path 96. The distortion signal 102 is coupled onto the main signal path 84 at the input side of the amplifier 86. The distortion signal 102 has a phase and amplitude such that the distortion signal 102 on the main signal path combines to cancel or at least reduce the distortion generated from amplifying the input signal to produce the amplified output signal with reduced distortion at the output of the amplifier 86. A variable phase and/or amplitude adjuster 136 on the feedback path 96 is responsive to the residual distortion spectrum in the amplified output signal on the main signal path 84 to adjust the phase and/or amplitude of the distortion signal on the feedback path 96 to improve cancellation of the distortion generated by the amplifier 86. In this embodiment, a power divider 138 obtains a representation or sample of the sample amplified output signal on the feedback path 96.

In a particular implementation of the feedback amplifier architecture of FIG. 1, the power amplifier stage 86 is an amplifier module normally with 40 dB (or larger) gain and is operating with just a few dB (or 0 dB) back-off to its $P_{1\,dB}$ point to get high efficiency (30%, typically). As such, there are inter-modulation components or distortion 90 at its output if no linearization is implemented, as shown on the figure for a two single tone input signal 82. The output power (non distortion spectrum 88 and distortion spectrum 90) of the amplifier 86 is sampled by directional coupler 94 which has normally a 30 dB coupling attenuation. The sample amplified output signal 92 contains the distortion spectrum and the non-distortion spectrum (which is just a linear image of the transmitter (TX) input signal 82).

The sample amplified output signal is fed to a variable attenuator 142 where its amplitude is adjusted to be equal to the amplitude of the input signal sample on the carrier cancellation path 122. After the variable attenuator 142, the sample amplified output signal is fed to the combiner 126 where it is combined with the phase shifted (by phase shifter 127) input signal sample on the carrier cancellation path 122. After the combiner 126, the non-distortion spectrum is cancelled, leaving the distortion spectrum on the feedback path 96. The distortion spectrum is fed to the following variable amplifier stage 146 where it is so amplified that the total loop attenuation from the directional coupler 94 at the output of the main amplifier 86 to the combiner 104 will be equal to the total gain of the main amplifier 86. The signal out from this variable amplifier 146 is fed to a phase shifter 148 where its phase is shifted by 180°-Q, where Q is a constant and is the total phase shift generated by all the components in the feedback loop (they should all operate in linear region), including the phase shift (which is a constant, as will be explained) generated by the amplifier to the feedback distortion signal. The distortion signal out from the phase shifter 148 is fed to an isolator 150 and then is fed back to the input side of the main amplifier 86. The feedback distortion signal has the proper amplitude and phase, after being amplified by the main amplifier 86, to cancel with the distortion generated by the main amplifier 86 to the input signal from the transmitter (TX).

In this case, an assumption is implied that the distortion generated by the amplifier stage 86 to the feedback distortion signal can be neglected. This is normally true because the feedback distortion signal is normally 20 dB lower than the input signal from the transmitter if the power amplifier stage 86 is operating at its $P_{1\,dB}$ level or lower output level. The reason is that, normally, the $IP_3$ (the output third intercept point) is 10 dB higher than $P_{1\,dB}$ for RF power amplifiers. So, if the output power is at the $P_{1\,dB}$ level, the distortion (the maximum distortion component is the third order inter-modulation) is 20 dB or more lower than $P_{1\,dB}$ of the output power of the amplifier. Thus, at its input, the feedback signal is 20 dB lower than the transmitter signal. In this case, the main amplifier 86 operates in its linear region to the feedback distortion signal and the phase shift generated by the main amplifier 86 to the feedback signal is a constant.

Note, the power within the feedback loop is about 20 dB lower than the power from the transmitter and can be at least 60 dB lower than the output power of the power amplifier. So, the feedback circuit consumes only little power and will not affect the total efficiency of the system.

For wide band applications (the power amplifier amplifies a wide band RF signal), the phase shifters used in this invention have to have a wide frequency band, namely, its phase shift under fixed control signal level has to keep constant or varies less than 1 degree over a wide frequency range (typically, over 50 MHz for 10 MHz RF channel band-width). Such wide band phase shifters are available by using vector modulators.

Figure 2:
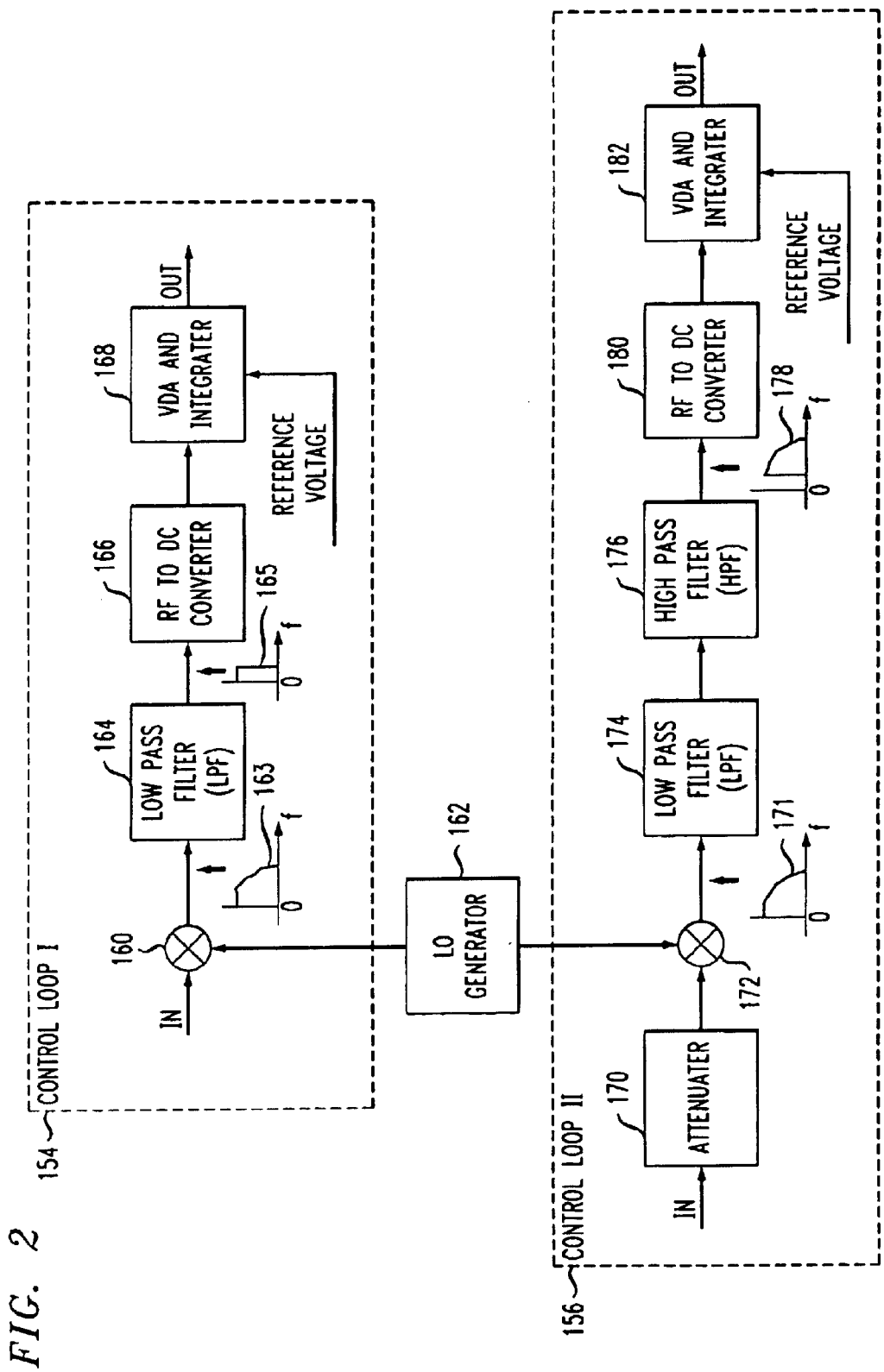
FIG. 2 shows an embodiment of the control loops used in an embodiment of the amplifier distortion reduction system using distortion feedback according to principles of the present invention.

FIG. 2 shows the block diagram for the two control loops, control loop-1 (154) and control loop-2 (156) for use with an embodiment of the amplifier distortion reduction system of FIG. 1. The control loop-1 (154) maintains the non-distortion spectrum cancellation. The signal out from the combiner 126 is branched into the control loop-1 (154) using power divider 158 and down converted to baseband signal by a mixer 160 in loop-1 (154). A local oscillator (LO) 162 produces an LO frequency signal which is the same as the carrier frequency of the transmitter carrier. Then the baseband signal 163 is fed to a low pass filter (LPF) 164 which has a sharp cut-off edge at 0.5*Bw, where Bw is the RF channel band-width. This LPF 164 will also reject the LO leakage from the mixer 160 and LO harmonics leakage. The signal out from the LPF 164 is the residual non-distortion spectrum (but frequency shifted to baseband) 165, and the distortion spectrum is rejected. The residual non-distortion spectrum power is further converted to DC voltage by an RF to DC converter 166 and fed to an VDA & integrator (VDA: voltage differential amplifier) 168. The output polarity switch point of the integrator is controlled by a reference signal. The output of the integrator is used to control the phase shifter 127 (FIG. 1) and the variable attenuator 142 (FIG. 1) to maintain the cancellation of the non-distortion spectrum at the output of the combiner 126.

The control loop-2 (156) maintains cancellation of the distortion spectrum. The sample amplified output on the feedback path 96 is branched to this loop by coupler or power divider 138 (FIG. 1) and attenuated (as shown by attenuator 170). The branched signal is down-converted to a baseband signal 171 by a mixer 172. This baseband signal is fed to a LPF 174 and a high pass filter (HPF) 176. The LPF 174 is a low order filter and is for the rejection of the LO leakage. This LPF 174 has its cut-off frequency a distance from the distortion spectrum (for example, a cut-off frequency at 0.5*Fc, where Fc is the carrier frequency). The HPF 176 is a high order filter with a sharp cut-off edge at 0.5*Bw, where Bw is the RF channel band-width. After the HPF 176, only the frequency shifted, residual distortion spectrum 178 is passed. Then, the power of the residual distortion spectrum is converted to DC voltage by RF to DC converter 180 and is fed to a VDA & integrator 182. The output of the integrator is used to control the phase shifter 148 (FIG. 1) and the variable amplifier 146 (FIG. 1) to maintain the cancellation of the distortion spectrum.

Note, in this embodiment, the pick-up of the residual non-distortion spectrum and the pick-up of the residual distortion spectrum is done in baseband frequency range. This has the advantage that the implementation of the high order LPF (164) in loop 1 and the HPF (176) in loop 2 is more convenient and more accurate in baseband than in IF band and even better than in the RF band. However, other embodiments are possible.

Figure 3:
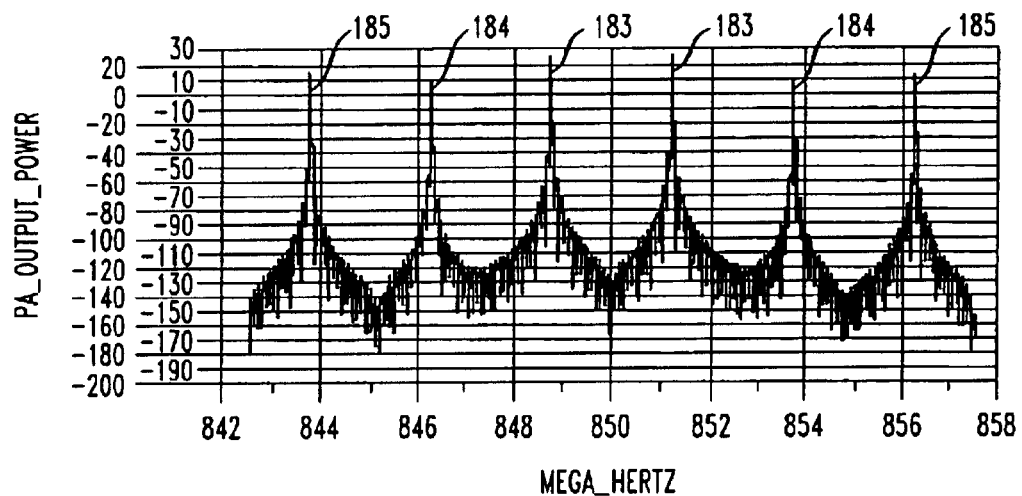
FIG. 3 shows an amplifier output spectrum without radio frequency (RF) distortion feedback cancellation.
Figure 4:
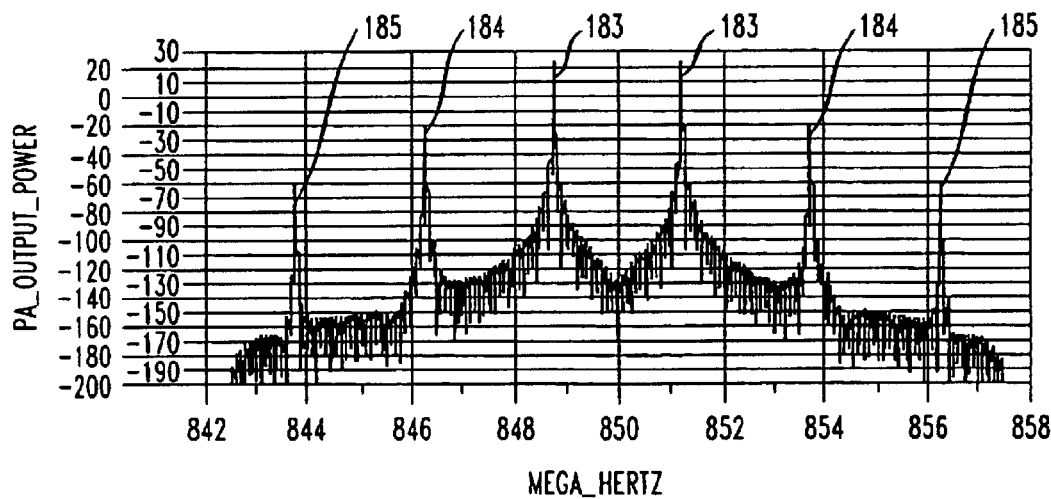
FIG. 4 shows an amplifier output spectrum with RF distortion feedback cancellation according to principles of the present invention.

A simulation was carried out for the feedback amplifier of FIG. 1. FIG. 3 shows the amplifier output spectrum for the case without RF distortion feedback cancellation, and FIG. 4 shows the amplifier output for the circuit of FIG. 1 with RF distortion feedback cancellation. In this example, the input signal to the amplifier are two single tone signals, which are the two central signals (183) shown in FIGS. 3 and 4 along with the $3^{rd}$ order (184) and $5^{th}$ order (185) inter-modulation components. As can be seen in FIGS. 3 and 4, when the RF distortion feedback cancellation is applied, both the $3^{rd}$ (down by 30 dB) and the $5^{th}$ order (down by 70 dB) inter-modulation components are considerably suppressed.

Figure 5:
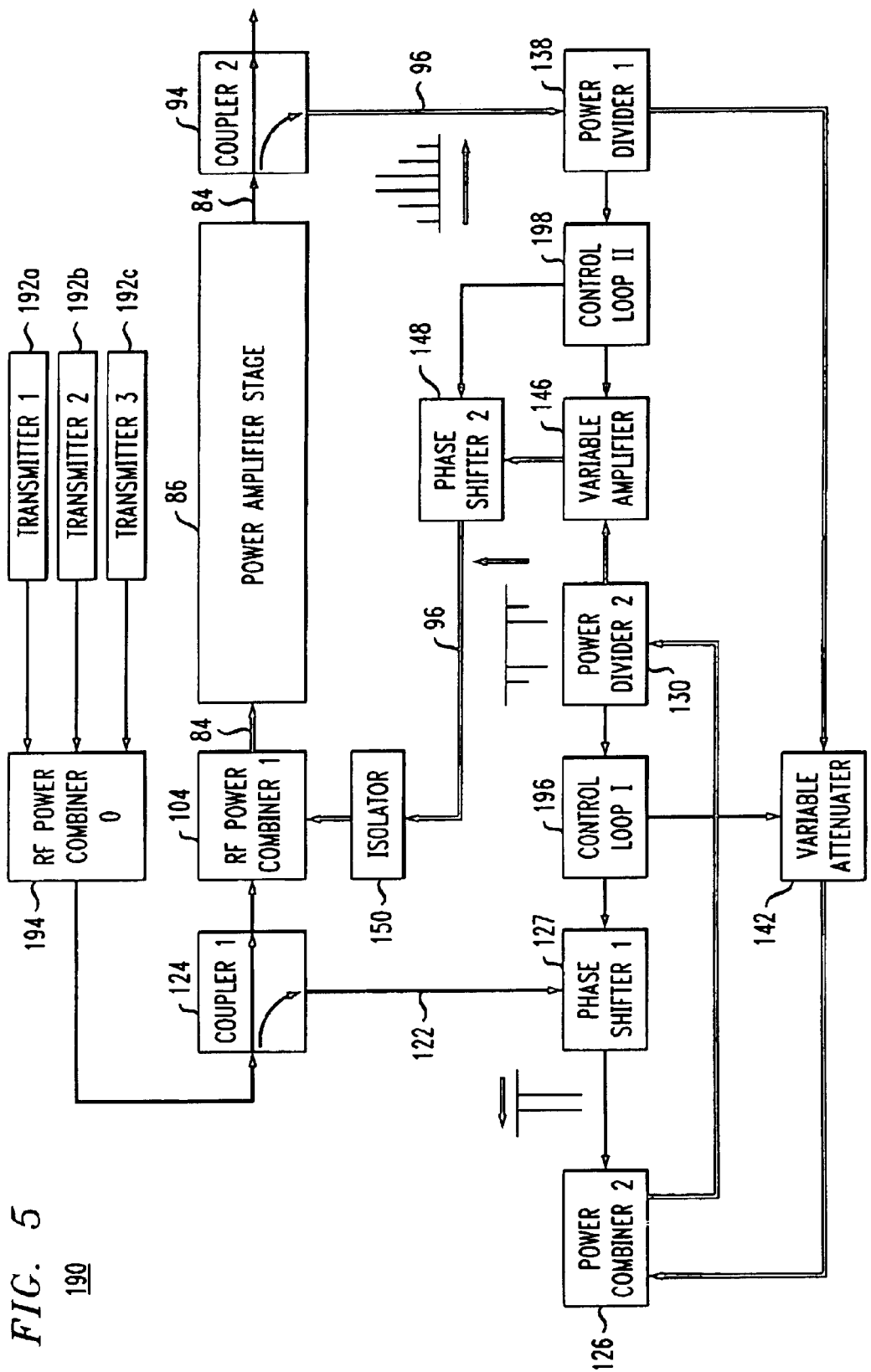
FIG. 5 shows a multiple carrier embodiment of the amplifier distortion reduction system using distortion feedback according to principles of the present invention.

FIG. 5 shows an embodiment 190 of the distortion reduction system using distortion feedback for a multi-carrier amplifier (or an amplifier which amplifies several wide-band RF channels at the same time). In this example, multiple carriers from a plurality of transmitters 192a–c are combined by a combiner 194 to be amplified by the amplifier 86. No matter how many channels are operating, the non-distortion spectrum can be obtained from the output of the combiner 194, while the mixed spectrum is obtained from the output of the power amplifier 86. So, the basic method for linearization of one carrier amplifier is applicable to multi-carrier cases. For multi-carrier cases, two null loops (control loop 196 for maintaining cancellation of the non-distortion spectrum and control loop 198 for maintaining cancellation of the distortion spectrum) are implemented to avoid inter-channel interference.

FIG. 6a shows the flow diagram of the control loop 196, and FIG. 6b shows the flow diagram for the control loop 198. Only one channel is monitored by control loop 196, and in this embodiment, that channel is the channel with the lowest carrier frequency. In control loop 196, one branch output of the power divider 130 (FIG. 5) is frequency converted to an intermediate frequency (IF) using mixer 200 and a LO generator 202. The resulting frequency converted signal 203 is provided to a band pass filter 204 to pick up the residual non-distortion spectrum of the considered channel. In this embodiment, the cut-off edges of the band pass filter 204 are set at $F_{IF}$-0.5*Bw and $F_{IF}$, where Bw is the RF channel bandwidth and $F_{IF}$ is the IF frequency. As such, the non-distortion spectrum at the lower frequency side of the lowest frequency carrier is picked up. The frequency shifted, residual non-distortion spectrum 205 is further converted to DC voltage by an RF to DC converter 206 and fed to an VDA & integrator (VDA: voltage differential amplifier) 208. The output polarity switch point of the integrator is controlled by a reference signal. The output of the integrator is used to control the phase shifter 127 (FIG. 5) and the variable attenuator 142 (FIG. 5) to maintain the cancellation of the non-distortion spectrum at the output of the combiner 126 (FIG. 5).

Control loop 198 monitors only one channel for maintaining cancellation of distortion spectrum, and in this embodiment, the channel is the one with the highest carrier frequency. The sample signal from the output of the main amplifier 86 is branched to this loop by a power divider 138 (FIG. 5) and attenuated (as shown by attenuator 210). The sample is down converted to a baseband signal 212 by mixer 214 and LO generator 216, which in this embodiment is set to be equal to the highest carrier frequency. As such, the distortion spectrum at the high frequency side of the highest frequency carrier will be picked up in the loop 198 for monitoring purposes. This baseband signal is fed to a LPF 218 and a high pass filter (HPF) 220. The LPF 218 is a low order filter and is for rejection of the LO leakage. This LPF 218 has its cut-off frequency a distance from the distortion spectrum (for example, at 0.5*Fc, where Fc is the carrier frequency). The HPF 220 is a high order filter with a sharp cut-off edge at 0.5*Bw, where Bw is the RF channel band-width. After the HPF 220, only the frequency shifted, residual distortion spectrum is passed. Then, the power of the residual distortion spectrum is converted to DC voltage by RF to DC converter 222 and is fed to a VDA & integrator 224. The output of the integrator is used to control the phase shifter 148 (FIG. 5) and the variable amplifier 146 (FIG. 5) to maintain the cancellation of the distortion spectrum.

Note, in control loop 196, the LO frequency is set to $F_{CL}$-$F_{IF}$, where $F_{CL}$ is the lowest carrier frequency and $F_{IF}$ is in the low IF band, for example 70 MHz. The output power of the main amplifier 86 is limited so that the distortion spectrum of each channel will not spread for more than one RF channel bandwidth. Under the above conditions, the control loop 198 will pick up the distortion spectrum at the high frequency side of the carrier for the channel with the highest carrier frequency, and control loop 196 will pick up the non-distortion spectrum at the low frequency side of the carrier for the channel with the lowest carrier frequency. The inter-channel interference will not be picked up by either control loop. Therefore, a correct adaptation is maintained. In case there is a dominant channel in the multi-channel case this channel should be selected by the two control loops. Alternative embodiments are possible.

FIG. 7 shows a block diagram of another embodiment of the feedback amplifier system using a different implementation for the distortion feedback circuitry 98 which produces a distortion signal on the feedback path 96 and feeds back the distortion signal to the input side of the amplifier 86 to reduce the distortion produced at the output of the amplifier 86. In this embodiment, the distortion signal is obtained from the amplifier output by sampling the amplifier output and filtering out the non-distortion spectrum from the sample amplified output signal to leave the distortion spectrum on the feedback path 96. In the particular implementation of FIG. 7, where like reference numerals correspond to analogous components, the amplifier distortion reduction system 230 picks up the distortion spectrum from the output side of the amplifier 86. In this embodiment, the coupler 94 places a representation or sample of the amplified output signal onto the feedback path 96. In this embodiment, the sample on the feedback path is frequency down-converted into an IF signal by down-converter 232. The non-distortion spectrum is filtered out by a filter block 234, such as a filter-equalizer combination in the IF band. The frequency shifted distortion spectrum 235 is then up-converted to RF band again by up-converter 236 and fed into the input side of the amplifier by the combiner 104. An amplitude and/or phase shifter 238 adjusts the amplitude and/or phase of the distortion signal such that the distortion signal is inverse in phase and equal in amplitude to the distortion to be generated by the amplifier 86 when amplifying the input signal. The advantage of the down-up conversion is that the filter will perform better in the IF band, and the implementation of the filters and/or equalizers in the IF band is easier than in the RF band. Embodiments are possible where the distortion spectrum remains at RF on the feedback path 96.

In a particular implementation of the feedback amplifier architecture of FIG. 7, the power amplifier module normally with 40 dB (or larger) gain and is operating with just a few dB (or 0 dB) back-off to its $P_{1\ dB}$ point to get high efficiency (30%, typically). As such, there is inter-modulation distortion generated at the amplifier output. If no linearization is implemented, spectral regrowth is seen at the output for a raised cosine filtered spread spectrum input. The output power is sampled by the directional coupler 94 which has normally a 30 dB coupling attenuation. The sampled RF signal is further attenuated by about 40 dB or more by attenuator 252 to keep the following mixer working in such a state that its high harmonic terms are very low. The sampled RF signal is converted to an IF signal 254 centered at FPF by the down-conversion mixer 232, which is just a balanced mixer and not necessary being a demodulator, and the LO generator 256. The IF signal is fed to a low pass filter 234. This low pass filter 234 has a sharp cut-off edge which is at $F_{IF}$-0.5*Bw where Bw is the RF channel bandwidth. The passed spectrum out from the LPF 234 is the distortion spectrum at the low frequency side of the carrier. The local oscillator signal leakage is also rejected by the LPF 234. The distortion spectrum out from the LPF 234 is fed to an equalizer 258.

Because the LPF 234 has a sharp cut-off edge, its phase shift versus frequency is not linear, especially near the cut-off frequency. The purpose of the equalizer 258 is to linearize the non-linear phase shift versus frequency characteristics generated by the LPF 234 so that the phase shift versus frequency characteristics of the distortion spectrum after the equalizer 258 is linearly calibrated (in other words, the delay is a constant). This phase shift linearization is used in this embodiment, otherwise the picked-up distortion spectrum may not be made phase reversed uniformly compared to the distortion spectrum at the output of the amplifier. Note, the equalizer is in the IF frequency range (typically 70 MHz) which is easier to implement.

The distortion spectrum 235 out from the equalizer 258 is up-converted to RF band at the up-converter 236. The fall distortion spectrum at both sides of the carrier is recovered. Note, the input signal level to the mixer 236 is still very low so the high harmonic modulation components generated by the up-converter 236 can be neglected.

The distortion spectrum centered at the carrier frequency is fed to a RF band pass filter 260. The purpose of the band pass filter (BPF) is to reject the local oscillator signal leakage from the up converter 236 and its harmonics leakage. The cut-off edges of the BPF 260 can be designed a distance from the frequency range of the distortion spectrum. As such, another equalizer need not be inserted after the BPF to linearize the group delay generated by the BPF at its cut-off edges. The RF distortion spectrum 262 out from the BPF 260 is amplified by amplifier 264 to a level so that the total loop attenuation from the directional coupler 94 to the isolator 266 is equal to the linear gain of the power amplifier stage 86. The amplified distortion spectrum is phase shifted at a phase shifter 268 by 180°-Q, where Q is the total phase shift for the feedback signal to travel through the whole feedback loop, except the phase shifter 268 itself, from the directional coupler 94 through the down-up conversion loop to the output of the isolator 266. Q includes the phase shift generated by the main power amplifier 86 to the feedback signal (which is a constant as will be explained below). Because the phase shift versus frequency character of the distortion spectrum is already linear at the input of the phase shifter 268, such a constant phase shift over the whole distortion spectrum is possible.

The phase shifted distortion spectrum is fed to the isolator 266, and then is fed back to the input side of the power amplifier stage 86 through the power combiner 104. The feedback distortion spectrum 270 with the appropriate amplitude and phase, after being amplified by the power amplifier stage 86, will cancel the distortion generated by the amplifier 86 to the input signal from the transmitter. In this embodiment, the distortion generated by the amplifier stage 86 to the distortion signal can be neglected because the main amplifier 86 operates in its linear region to the distortion signal, and the phase shift generated by the main amplifier 86 to the distortion signal is a constant.

Note, in this example, the maximum power within the feedback loop is about 20 dB lower than the power from the transmitter and at least 60 dB lower than the output power of the power amplifier 86. So, the linearization circuit consumes little power and will not affect the total efficiency of the system. For wide band applications (the power amplifier operates with a wide band RF input spectrum), the phase shifter used in this example has a wide frequency band in that its phase shift under a fixed control signal level has to keep constant or varies less than 1 degree over a wide frequency range (typically, over 50 MHz for 10 MHz RF channel bandwidth). Such wide band phase shifters are available by using vector modulators.

Figure 8:
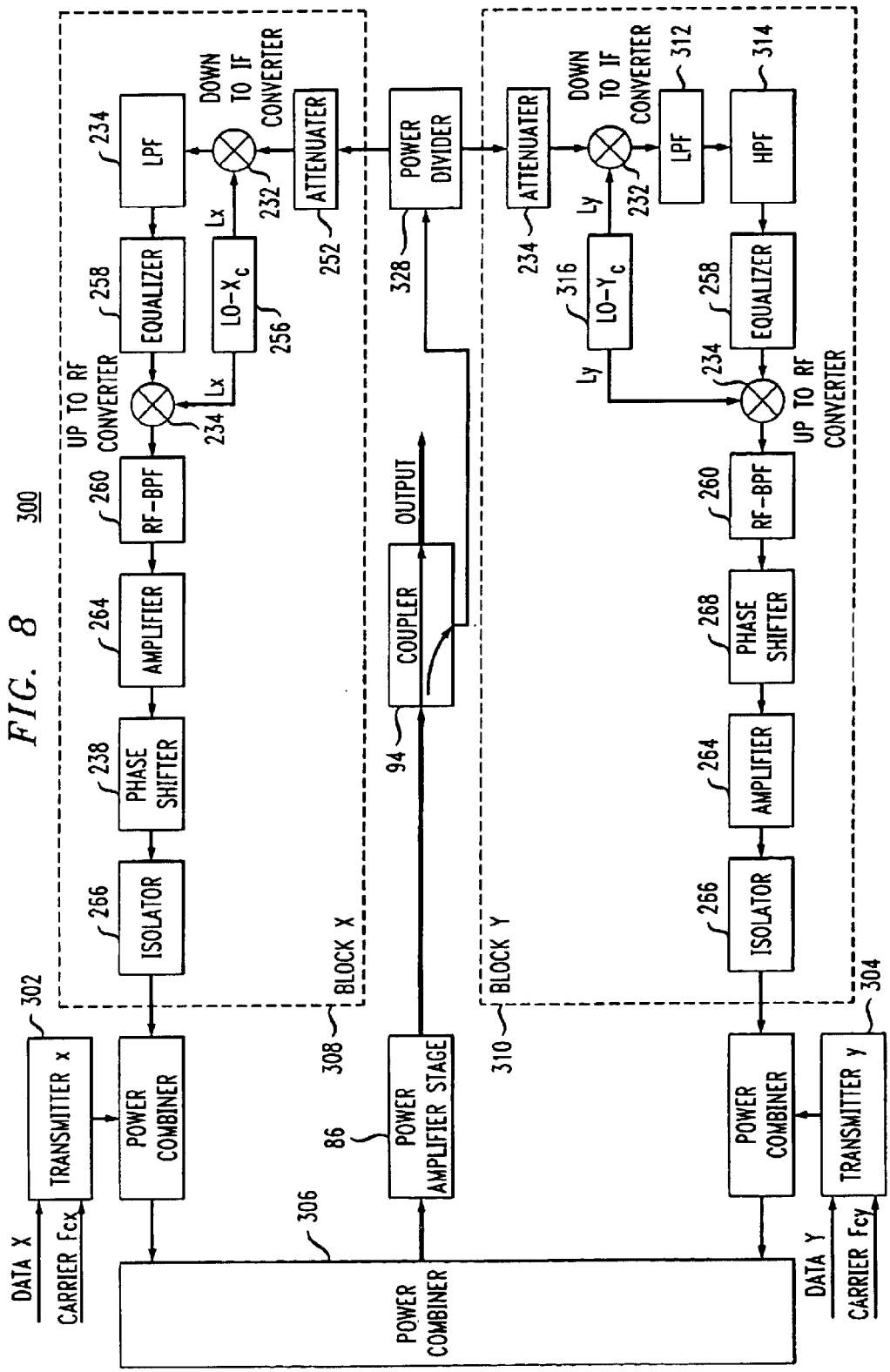
FIG. 8 shows a multiple carrier embodiment of the amplifier distortion reduction system using distortion feedback with conversion through an intermediate frequency (IF) band according to principles of the present invention.

FIG. 8 shows an embodiment of the amplifier distortion reduction system in which multiple RF channels are amplified at the same time. In this embodiment, where like reference numerals indicate analogous components, two RF channels are to be amplified where each RF channel has a carrier frequency modulated by a separate data series. These two RF channels may be neighboring channels or not. In FIG. 8, two RF signals from two transmitters, X (302) and Y (304), are combined together by a power combiner 306 and fed to the power amplifier 86. Each transmitter 302 and 304 has its own carrier and data input. For convenience of description, carrier frequency Fcx of transmitter X (302) is assumed to be lower than the carrier frequency Fcy of transmitter Y (304). In this embodiment, there are two linearization feedback loops, block X (308) and block Y (310). Block X (308), which is for the low frequency carrier channel, is analogous to what is described for FIG. 7.

Block Y (310), which is for the high frequency carrier channel, has a LPF 312 and a HPF 314, where the LPF 312 is to reject the LO generator 316 leakage and a sharp cut-off edge design is not necessary for it. The HPF 314 is to pick up the distortion spectrum at the high frequency side of the high frequency carrier and a sharp cut-off frequency at FIF+0.5*Bw is used. The two feedback loops have same IF frequency (for example, 70 MHz), and the RF LO frequency Lx and Ly are selected based on the input channel carrier frequency.

The coupler 94 provides the full spectrum sample from the amplifier 86 to a power divider 328 which provides the full amplifier output spectrum sample to each loop corresponding to a carrier. In this embodiment, the two feedback loops 308 and 310 receive the full amplified spectrum. The feedback loop 308 will only pick up the distortion spectrum at the low frequency side of the carrier from the low frequency channel. Then, the full distortion spectrum originating from the transmitter X (302) will be recovered and phase shifted and fed back to the amplifier stage 86 for cancellation. The feedback loop block Y (310) will only pick up the distortion spectrum at the high frequency side of the carrier from the high frequency carrier channel. Then, the full distortion spectrum originating from the transmitter Y (304) will be recovered and phase shifted and fed back to the amplifier stage 86 for cancellation. In this way, there will not be interference between the two loops 308 and 310 if the distortion spectrum regrowth does not spread more than one RF channel bandwidth. As such, for the two carrier example, the saturation of the amplifier should be limited such that the distortion spectrum regrowth will not spread more than the RF channel bandwidth.

Figure 9:
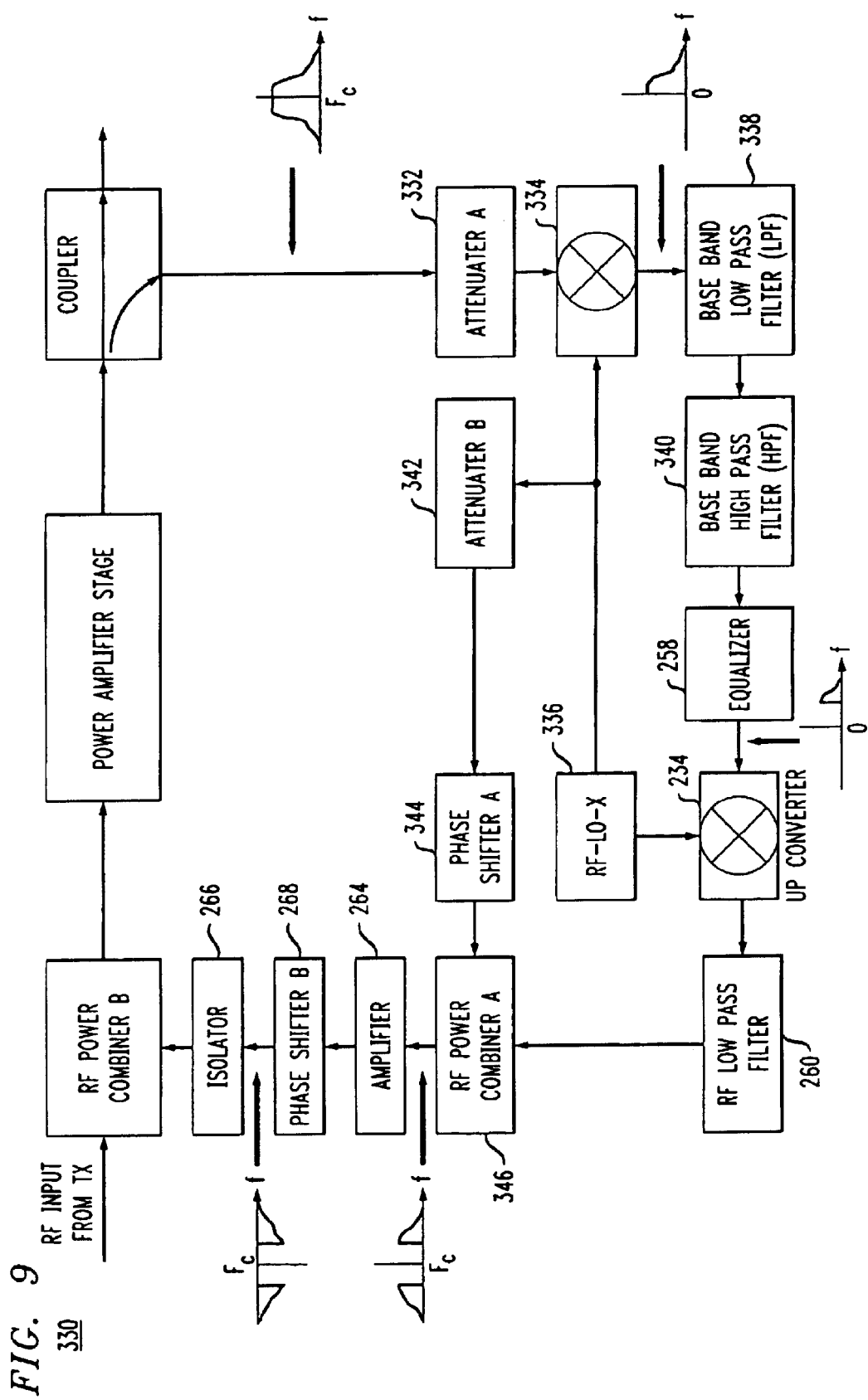
FIG. 9 shows an embodiment of the amplifier distortion reduction system using distortion feedback with conversion through a baseband frequency band according to principles of the present invention.

The distortion feedback cancellation scheme where the distortion signal is obtained by filtering the non-distortion spectrum can also be implemented by down to baseband conversion of a the sample of the amplifier output to obtain the distortion signal. In FIG. 9, where like reference numerals indicate analogous components, an amplifier distortion reduction system 330 is described for one carrier by using down to baseband conversion. A sample of the amplifier output spectrum attenuated by an attenuator 332 is down-converted to baseband using a mixer 334 and a local oscillator generator 336 (RF-LO-X). The baseband spectrum is fed to a filter combination. The filter combination now is a low pass filter 338 in series with a high pass filter 340. Note, the baseband high pass filter 340 has a sharp cut-off edge at 0.5*Bw, where Bw is the RF channel band width. The purpose of this filter 340 is to pick up the distortion spectrum at the high frequency side of the carrier. The baseband low pass filter 338 is just for rejecting the LO leakage and does not need to be of a sharp cut-off edge design, and therefore, can be a low order design. Note, the full distortion spectrum at both sides of the non-distortion spectrum is recovered after the up-converter 234. Then, the recovered distortion spectrum is phase shifted and amplified to produce the distortion signal.

There is an additional branch in the circuit, which is made of attenuater B (342), phase shifter A (344) and power combiner 346, to cancel possible LO leakage from the up-converter 234. The LO leakage at its harmonic frequencies is rejected by the RF low pass filter 260, which is again a low order design and its cut-off edge is a distance from the distortion spectrum. This scheme is a little more complicated than the scheme described in FIG. 7 but has the advantage that the implementation of the high order HPF 340 in baseband is more convenient than in the IF band.

In addition to the embodiments described above, alternative configurations or implementations of the amplifier distortion reduction system according to the principles of the present invention are possible which omit and/or add components and/or use variations or portions of the described system. The amplifier distortion reduction system has been described as amplifying single or multiple channels. The number and nature of the channels may vary, such as TDMA (30 KHz channel bandwidth), Global System for Mobile Communications (GSM)(200 KHz channel bandwidth), CDMA (1.28 MHz channel bandwidth), wideband CDMA (5 MHz channel bandwidth), and Universal Mobile Telecommunication Systems (UMTS)(3.84 MHz channel bandwidth), depending on the application as does the particular implementation or configuration of the amplifier distortion reduction system using distortion feedback. Depending on the implementation, the relative gain and/or phase circuitry, equalizer circuitry and/or filter arrangement(s) can be positioned in different locations and/or paths within the amplifier distortion reduction system or implemented in different configurations or arrangements. Additionally, particular implementations of the feedback distortion circuitry are described, but alternative configurations are possible.

Furthermore, the amplifier distortion reduction system has been described using a particular operation without digital conversion, but it should be understood that the amplifier distortion reduction system and portions thereof can be implemented in application specific integrated circuits, software-driven processing circuitry, firmware, programmable logic devices, hardware or other arrangements of discrete components and/or in the digital domain as would be understood by one of ordinary skill in the art with the benefit of this disclosure. What has been described is merely illustrative of the application of the principles of the present invention. Those skilled in the art will readily recognize that these and various other modifications, arrangements and methods can be made to the present invention without strictly following the exemplary applications illustrated and described herein and without departing from the spirit and scope of the present invention.

What is claimed is:

1. A method of producing an amplified signal, said method comprising the steps of:

sampling an input signal to be amplified on a signal path onto a carrier cancellation path;

amplifying said input signal on said signal path by an amplifier on said signal path to produce said amplified signal with distortion;

sampling said amplified signal with distortion to produce a sample amplified signal with distortion on a feedback path;

combining said sample input signal on said carrier cancellation path with said sample amplified signal with distortion on said feedback path to obtain a distortion signal on said feedback path;

sampling said distortion signal to produce a sample distortion signal;

frequency down-converting said sample distortion signal;

filtering said sample distortion signal to produce a residual non-distortion signal;

responding to said residual non-distortion signal by generating at least one control signal from said residual non-distortion signal using a voltage differential amplifier and integrator; and placing said distortion signal from said feedback path onto said signal path prior to said amplifier to reduce distortion produced from said amplifier.

2. The method of claim 1 comprising the steps of:

phase shifting of said sample input signal on said carrier cancellation path prior to said step of combining; and attenuating said sample amplified signal with distortion prior to said step of combining.

3. The method of claim 2 comprising the step of:

responding to said residual non-distortion signal by adjusting said phase shifting said sample input signal and attenuating said sample amplified signal.

4. The method of claim 3 comprising the steps of:

frequency down-convening said sample distortion signal to baseband;

low pass filtering said baseband sample distortion signal to produce said residual non-distortion signal;

generating a control signal from said residual non-distortion signal using said voltage differential amplifier and integrator.

5. The method of claim 3 wherein said input signal has multiple carriers and said step of responding comprises the step of:

responding to said portion of said residual non-distortion signal corresponding to the lowest carrier frequency of said multiple carriers.

6. A method of producing an amplified signal, said method comprising the steps of:

sampling an input signal to be amplified on a signal path onto a carrier cancellation path;

amplifying said input signal on said signal path by an amplifier on said signal path to produce said amplified signal with distortion;

sampling said amplified signal with distortion to produce a sample amplified signal with distortion on a feedback path;

sampling said sample amplified signal with distortion to produce an output sample;

frequency down-converting said output sample;

filtering said down-converted output sample to produce a residual distortion signal;

responding to said residual distortion signal by generating at least one control signal from said residual distortion signal using a voltage differential amplifier and integrator;

combining said sample input signal on said carrier cancellation path with said sample amplified signal with distortion on said feedback path to obtain a distortion signal on said feedback path; and placing said distortion signal from said feedback path onto said signal path prior to said amplifier to reduce distortion produced from said amplifier.

7. The method of claim 6 comprising the steps of:

responding to said residual distortion signal to control phase shifting and amplifying said distortion spectrum.

8. The method of claim 7 wherein said step of responding comprising the steps of:

attenuating said output sample;

frequency down-converting said output sample to baseband;

filtering said output sample using a low pass filter and a high pass filter to produce said residual distortion signal; and providing said residual distortion signal to a voltage differential amplifier and integrator to control said steps of phase shifting and amplifying said distortion signal.

9. The method of claim 6 wherein said input signal has multiple carriers and said step of responding comprises the step of:

responding to said portion of said residual distortion signal corresponding to the highest carrier frequency of said multiple carriers.

10. A method of producing an amplified signal, said method comprising the steps of:

amplifying an input signal on said signal path by an amplifier on said signal path to produce an amplified signal with distortion;

sampling said amplified signal with distortion to produce a sample amplified signal with distortion on a feedback path;

down-converting said sample amplified signal with distortion on said feedback path;

filtering a non-distortion spectrum from said down-converted sample amplified signal with distortion to produce a down-converted distortion signal;

up-converting said down-converted distortion signal on said feedback path to recover said distortion signal; and placing said distortion signal from said feedback path onto said signal path prior to said amplifier to reduce distortion produced from said amplifier.

11. The method of claim 10 comprising the steps of:

down-converting said sample amplified signal with distortion on said feedback path to an intermediate frequency (IF);

producing an IF image of the distortion spectrum portion on said feedback path by low pass and high pass filtering of said IF sample amplified signal with distortion; and up-converting said IF image of the distortion spectrum portion on said feedback path to radio frequency (RF) and recover a RF distortion spectrum.

12. The method of claim 10 comprising the steps of:

down-converting said sample amplified signal with distortion on said feedback path to a baseband frequency;

producing a baseband image of the distortion spectrum portion on said feedback path by low pass and high pass filtering of said baseband sample amplified signal with distortion; and up-converting said image of said baseband distortion spectrum portion on said feedback path to radio frequency (RF) to recover a RF distortion spectrum.

13. An amplifier distortion reduction system, said system comprising:

an amplifier on a signal path adapted to amplify said input signal on said signal path to produce an amplified signal with distortion;

a coupler on said signal path adapted to produce a sample of said amplified signal with distortion on a feedback path;

distortion feedback circuitry including a down-converter adapted to downconvert said sample amplified signal with distortion on said feedback path, a filtering arrangement adapted to reduce a down-converted non-distortion spectrum of said down-converted sample amplified signal with distortion to leave a down-converted distortion spectrum on said feedback path, and an up-converter adapted to up-convert said down-converted distortion spectrum on said feedback path to produce a distortion signal on said feedback path, said distortion feedback circuitry adapted to place said distortion signal on said signal path prior to said amplifier to reduce distortion from said amplifier.

14. The system of claim 13 wherein said down-converter is adapted to down-convert said sample amplified signal with distortion on said feedback path to an intermediate frequency; and said up-converter is adapted to up-convert said down-converted distortion spectrum on said feedback path to radio frequency.

15. The system of claim 13 wherein said down-converter is adapted to down-convert said sample amplified signal with distortion on said feedback path to a baseband frequency; and said up-converter is adapted to up-convert said down-converted distortion spectrum on said feedback path to produce said distortion spectrum on said feedback path at radio frequency.

16. An amplifier distortion reduction system, said system comprising:

a splitting device adapted to place a sample of an input signal to be amplified on a signal path onto a carrier cancellation path;

an amplifier on a signal path adapted to amplify said input signal on said signal path to produce an amplified signal with distortion;

a coupler on said signal path adapted to receive said amplified signal with distortion on said signal path and to produce a sample amplified signal with distortion on a feedback path;

a combining device adapted to combine said sample input signal on said carrier cancellation path with said sample amplified signal with distortion on said feedback path to obtain a distortion signal on said feedback path;

a second splitting device on said feedback path adapted to sample said distortion signal to produce a sample distortion signal;

control circuitry including a frequency down-converter adapted to down-convert said sample distortion signal, a filter adapted to filter said sample distortion signal to produce a residual non-distortion signal, and said control circuitry adapted to respond to said residual non-distortion signal by generating at least one control signal from said residual non-distortion signal using a voltage differential amplifier and integrator; and a second combining device adapted to place said distortion signal from said feedback path onto said signal path prior to said amplifier to reduce distortion produced from said amplifier.

17. An amplifier distortion reduction system, said system comprising:

a splitting device adapted to place a sample of an input signal to be amplified on a signal path onto a carrier cancellation path;

an amplifier on a signal path adapted to amplify said input signal on said signal path to produce an amplified signal with distortion;

a coupler on said signal path adapted to receive said amplified signal with distortion on said signal path and to produce a sample amplified signal with distortion on a feedback path;

a second splitting device on said feedback path adapted to sample said sample amplified signal with distortion to produce an output sample;

control circuitry including a frequency down-converter adapted to down-convert said output sample, a filter adapted to filter said down-converted output sample to produce a residual distortion signal, and said control circuitry adapted to respond to said residual distortion signal by generating at least one control signal from said residual distortion signal using a voltage differential amplifier and integrator;

a combining device adapted to combine said sample input signal on said carrier cancellation path with said sample amplified signal with distortion on said feedback path to obtain a distortion signal on said feedback path; and a second combining device adapted to place said distortion signal from said feedback path onto said signal path prior to said amplifier to reduce distortion produced from said amplifier.

* * * * *